United States Patent
Childs et al.

(10) Patent No.: US 9,634,569 B1
(45) Date of Patent: Apr. 25, 2017

(54) DC-TO-DC OUTPUT CURRENT SENSING

(71) Applicant: Dialog Semiconductor (UK) Limited, London (GB)

(72) Inventors: Mark Childs, Swindon (GB); Paul Collins, Swindon (GB); Carlos Calisto, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 63 days.

(21) Appl. No.: 14/883,118

(22) Filed: Oct. 14, 2015

(51) Int. Cl.
*H02M 3/158* (2006.01)
*G01R 19/00* (2006.01)
*G01R 19/10* (2006.01)

(52) U.S. Cl.
CPC ........ H02M 3/158 (2013.01); G01R 19/0092 (2013.01); G01R 19/10 (2013.01)

(58) Field of Classification Search
CPC ..... H02M 3/156; H02M 3/158; H02M 3/1588
USPC ........................................ 323/271, 282, 284
See application file for complete search history.

(56) References Cited

U.S. PATENT DOCUMENTS

| | | | | |
|---|---|---|---|---|
| 6,329,801 | B1 * | 12/2001 | Zuniga | H02M 3/1563 323/282 |
| 7,772,818 | B2 | 8/2010 | Smith | |
| 8,698,470 | B2 | 4/2014 | Ju | |
| 8,810,157 | B2 | 8/2014 | Del Carmen, Jr. | |
| 9,077,242 | B2 * | 7/2015 | Causse | H02M 3/158 |
| 2005/0116697 | A1 * | 6/2005 | Matsuo | H02M 3/1584 323/282 |
| 2006/0125454 | A1 * | 6/2006 | Chen | H02M 3/1588 323/282 |
| 2008/0061758 | A1 * | 3/2008 | Nishida | H02M 3/156 323/284 |
| 2009/0322299 | A1 * | 12/2009 | Michishita | H02M 3/156 323/282 |
| 2011/0309815 | A1 * | 12/2011 | Yu | H02M 3/156 323/311 |
| 2014/0191744 | A1 * | 7/2014 | Choi | H02M 3/156 323/283 |
| 2015/0303800 | A1 * | 10/2015 | Childs | H02M 3/158 323/271 |
| 2016/0111956 | A1 * | 4/2016 | Childs | H02M 3/156 323/271 |
| 2016/0190923 | A1 * | 6/2016 | Veeramreddi | H02M 3/158 323/271 |
| 2016/0329734 | A1 * | 11/2016 | Lee | H02J 7/025 |

FOREIGN PATENT DOCUMENTS

DE     695 26 100     7/2002

OTHER PUBLICATIONS

German Office Action, File No. 10 2015 222 584.4, Applicant: Dialog Semiconductor (UK) Ltd, Mail date: Jun. 1, 2016, 7 pgs, and English language translation, 8 pgs.

* cited by examiner

*Primary Examiner* — Jeffrey Sterrett
(74) *Attorney, Agent, or Firm* — Saile Ackerman LLC; Stephen B. Ackerman

(57) ABSTRACT

Method and circuits enable measuring output current in DC/DC converters operating in pulse frequency modulation (PFM) mode and in pulse width modulation (PWM) mode. The method is applicable to DC/DC converters using an inductor at the output. Current is sampled on one pass transistor only. The DC/DC converter disclosed turns a PMOS transistor off when the output current reaches its current limit.

21 Claims, 5 Drawing Sheets

DC-TO-DC OUTPUT CURRENT SENSING

(1) TECHNICAL FIELD

This disclosure relates generally to DC-to-DC converters and relates specifically to a method to measure output current in buck converters operating in pulse frequency modulation (PFM) mode and in pulse width modulation (PWM) mode.

(2) BACKGROUND

Buck converters typically run in one of two modes: PFM (pulse frequency modulation) or PWM (pulse width modulation).

PFM mode is typically used for low load currents. In PFM mode the buck turns on a PMOS high-side switch when the output voltage falls below a reference voltage. The PMOS high-side switch is then turned off when the current in the coil reaches a threshold value (sleep current limit). A NMOS low-side switch is turned on when the PMOS high-side switch is turned off. The NMOS low-side switch is then turned off when the current in the coil is fully discharged. PFM mode is typically not used for large currents as the current limit is normally set low to maximize efficiency.

There is a general requirement for buck converters to have the output current measured—this measurement is often needed by the system in which the converter is integrated. Typically a buck only measures current only either on the PMOS or the NMOS. This means that the output current may only be measured either when the PMOS is on, or when the NMOS is on, and not all the time.

In prior art the output current of buck converters is measured in PWM mode only. A prior art sensing scheme is as follows: an LX voltage at a coil terminal is sensed during on-time of the PMOS high side-switch. The voltage is averaged over this time and, when the NMOS low-side switch is on, this average voltage is sampled instead of the LX voltage. Then the current is calculated from this sense voltage.

This current calculation is valid and no error is introduced in PWM mode. A long-term average of this current sense waveform correctly averages the output current of the buck.

The scheme discussed above does NOT apply during discontinuous PFM mode. Here the current waveform takes the form of a series of triangular pulses, with large periods of no-current between them.

If the average is taken during the PMOS on time, and is it then assumed whenever the PMOS is off, the average current will be much too high, as during a large period the coil current is actually zero.

Other schemes can be created where the current is sampled during the PMOS on-time, zero current is sampled during the time when neither pass-device is on, and then the average is used during the NMOS on-time. These schemes either add an error during the NMOS on-time, or are complex to implement.

In general, measuring the output current in DCM PFM is not practical with existing solutions.

It is a challenge to designers of DC-to-DC converters to find a method to measure the output current of a buck converter during PFM mode.

SUMMARY

A principal object of the present disclosure is to measure an output current of a buck converter during operating in continuous mode PWM as well as in discontinuous mode PFM.

A further object of the present disclosure is to achieve a buck converter which samples the output current on one pass device only.

In accordance with the objects of this disclosure a buck converter enabled for output current measurement in CCM PWM mode as well as in DCM PFM mode has been achieved. The buck converter disclosed firstly comprises: a main output stage comprising a PMOS pass transistor and an NMOS pass transistor both connected in series, wherein the PMOS pass transistor is connected to supply voltage VDD and a gate of the PMOS pass transistor is connected to a gate of a transistor of a first circuit branch, and the NMOS pass transistor is connected to ground, a coil, wherein a first terminal of the coil is connected to a mid-node between the PMOS pass transistor and the NMOS pass transistor and a second terminal of the coil is connected to an output port of the buck converter, and an output capacitor connected between the output port and ground. Furthermore the buck converter comprises said first circuit branch, configured to generating a first reference current comprising a first PMOS device, which is scaled to the PMOS pass transistor and to providing via a first voltage node a voltage representing an output current limit of the buck converter, a second circuit branch, configured to generating a second reference current, which is scaled to the first reference current, comprising a second PMOS device, which is scaled relative the first PMOS device, and to providing a second voltage node to be sampled in PFM mode, whenever either the PMOS pass device or the NMOS pass device is on, and a switch, wherein a first terminal of the switch may contact three contact points and a second terminal of the switch is connected to a filter, wherein a first contact point is connected to the second voltage node, a second contact point is connected to the mid-node between the PMOS pass transistor and the NMOS pass transistor, and a third contact point is connected to supply voltage, wherein the switch is configured in PFM mode to either sampling via the first contact point the second voltage node or to being connected via the third contact point to the supply voltage and in PWM mode either sampling via the second contact point the mid-node voltage between the PMOS pass transistor and the NMOS pass transistor or being connected to open circuit, wherein the buck converter is configured to switch the PMOS pass transistor off when an output current through the coil reaches a maximum current limit, which is indicated by the first voltage node, and then the current through the coil falls linearly until the coil is completely discharged.

In accordance with the objects of this disclosure a method for output current measurement of a buck converter in CCM PWM mode as well as in DCM PFM mode has been achieved. The method disclosed comprises, firstly, the steps of: (1) providing a buck converter operating in PWM mode or in PFM mode, comprising a PMOS and an NMOS pass transistor connected in series between VDD voltage and ground and a coil connected between a midpoint between both pass transistors and an output port of the buck converter, and a filter, (2) creating a voltage representing an output current limit reference against which a voltage at the midpoint is compared, and (3) creating a dummy midpoint voltage which is sampled to provide an average output current during an output current pulse. Furthermore the method disclosed comprises the steps of (4) checking if buck converter is in PWM mode and, if it so, sample by a switch between a mid-point voltage between both pass transistors or being connected to open circuit and pass the sampling result through the filter to get a long-term average of the output current and repeat step (4), else go to step 5, and (5)

checking if buck converter is in PFM mode and, if so, sample by a switch between the dummy midpoint voltage and supply voltage and pass the sampling result through the filter to get a long-term average of the output current and go to step 4.

In accordance with the objects of this disclosure a method for digital output current measurement of a buck converter in CCM PWM mode as well as in DCM PFM mode has been achieved. The method disclosed comprises, firstly, the steps of: (1) providing a buck converter operating in PWM mode or in PFM mode, comprising a PMOS and an NMOS pass transistor connected in series between VDD voltage and ground and a coil connected between a midpoint between both pass transistors and an output port of the buck converter, a filter, and a digital controller and (2) measuring during on-time of the PMOS pass transistor the output current of the buck converter. Furthermore the method disclosed comprises the steps of: (3) accumulating the measurement results during on-time of the PMOS pass transistor by the digital controller and adding to the accumulation a constant value equal to half of the sleep current limit value during on-time of the NMOS pass transistor wherein this constant value is identified by peak detection on the PMOS measurement in PFM mode, and (4) achieving a complete measurement of the output current of the buck converter in PWM and PFM mode by adding to the accumulation also zero codes for times when both PMOS and NMOS pass transistors are off.

BRIEF DESCRIPTION OF THE DRAWINGS

In the accompanying drawings forming a material part of this description, there is shown.

DETAILED DESCRIPTION

Disclosed are embodiments of methods and circuits to measure an output current of a buck converter during continuous mode operation and discontinuous mode operation. It should be noted that the method disclosed is applicable to voltage controlled buck converters as well as to current controlled buck converters.

The buck converter may be implemented in a Power Management Integrated Circuit (PMIC).

Figure 1:
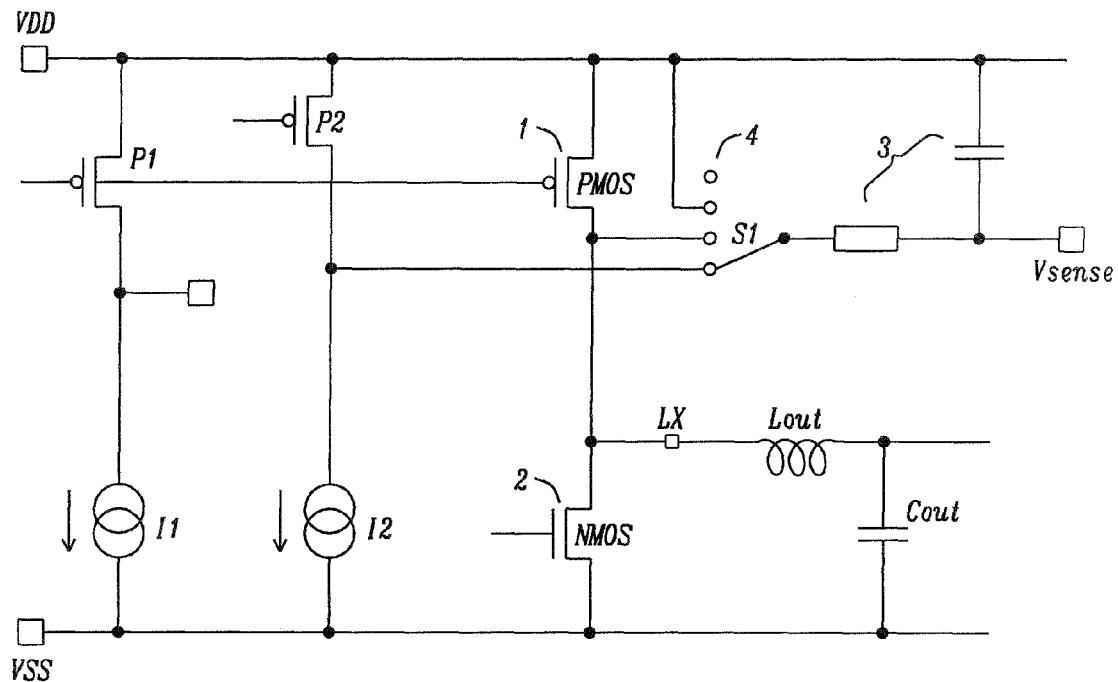
FIG. 1 shows an exemplary circuit of the buck converter disclosed.

FIG. 1 shows an exemplary circuit of the buck converter disclosed. The current in the coil Lout is charged up linearly to a current limit, the PMOS pass transistor 1 is then turned off and the current through the coil Lout falls linearly until the coil Lout is completely discharged. The current then remains zero until the cycle is restarted.

The pass devices PMOS 1 and NMOS 2 are connected to the coil Lout and to the output capacitor Cout.

Two scaled matched devices P1 and P2 are shown. Device P1 and the bias current I1 are used to create the current limit reference, against which the voltage at node LX is compared with the voltage drop across the device P1.

The scaled device P2 and current I2 are then used to generate a dummy LX voltage, that is the voltage across device P2, which is sampled to give the average current during the output current pulse. This circuit is arranged so that either device P2 is twice as wide as device P1 or current I2 is half that of current I1.

The gate of P2 is controlled in a way that it is either always on or that it is on whenever the NMOS pass transistor is on.

In PWM mode the switch S1 is either sampling LX or is connected to open-circuit. In PFM mode the switch S1 is either sampling the drain voltage of P2 or is connected to supply voltage (or is connected alternatively to the drain voltage of P2 while current I2 is not sampling). Current I2 is left on all the time for setting purposes but I2 is not sampling when the NMOS is off.

A filter 3, connected to the node Vsense, then creates the long-term average.

It should be noted that a state machine controls if the system operates in PFM or in PWM mode.

The average current is half the peak current because the coil current is triangular, and the average current through the coil Lout can be accurately described by a pulse of half the peak current for the duration of both the PMOS and NMOS on-times. The long term average output current is then the long term average of this rectangular pulse over several cycles. This can be achieved using a simple, long-time-constant low-pass filter.

As the peak current is known, and is equal to the current limit, the half-peak-current pulse can be easily re-created inside the buck converter.

The current limit is e.g. implemented inside the buck converter by providing the scaled reference PMOS device P1, through which a reference current is passed. The LX voltage is then directly compared to the voltage across this scaled device P1. When the LX voltage falls below this reference voltage across device P1, the current limit is reached and the PMOS is turned off.

The disclosure therefore proposes to provide the second scaled reference PMOS device P2, to match the device P1 that creates the current limit. A reference current I2, matched to current I1 is used to create the current limit and flows through this second scaled device P2. Either the scaled device P2 has twice the effective width of the current limit device P1, or the matched current I2 is half of current I1. In a preferable embodiment of the disclosure device P2 should be 50% larger than device P1.

The device P2 needs to be larger than device P1 so that the voltage drop across device P2 is half the voltage drop of device P1. The device P2 has not to be 50% larger than device P1, e.g. 30-40% larger. Since the voltage drop across device P2 should be half the voltage drop across device P1—so either device P2 having 2× the width of P1 (with currents I1 and I2 being the same) or having both devices P1 and P2 the same size and having current I2 half of the amount of current I1.

The gate of device P2 is controlled so that P2 is either always on, when the switch S1 is sampling its drain voltage, or that it is on whenever the NMOS pass transistor is on in another embodiment as shown in FIG. 6.

Figure 6A:
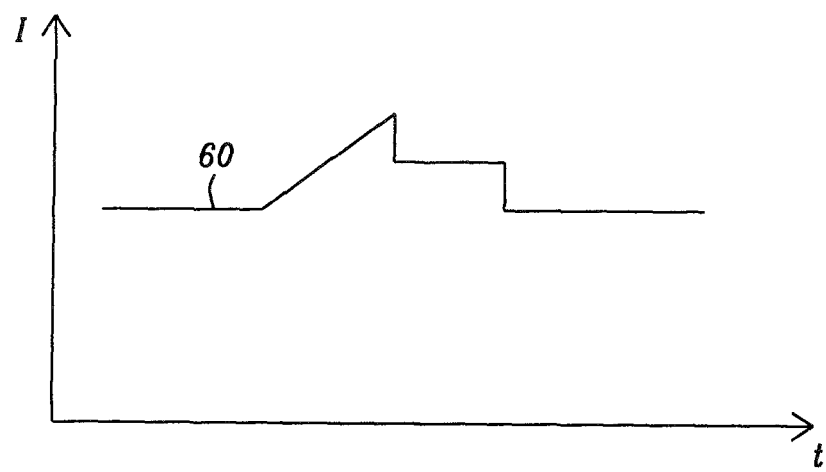
FIG. 6a illustrates an alternative embodiment of the disclosure wherein the gate of device P2 is controlled so that P2 is either always on whenever the NMOS pass transistor is on FIG. 6b shows time charts of the current through the coil Icoil and the current sensed Isense in case of the PFM mode during different phases

FIG. 6a shows a time chart of the current through the PMOS pass transistor wherein the actual current 60 through the PMOS pass transistor is measured.

It should be noted that he measurement during the PMOS on-time is done directly by measuring the voltage drop across the PMOS pass transistor. During the NMOS pass transistor on-time the current value is only an estimate. However, the estimate during the NMOS pass transistor on-time has nothing to do with the measured value during the PMOS pass transistor on-time. Instead we use half the current limit value. It is known that the current in the coil must be linear, it must start at the current limit value (because that is when we would have turned off the PMOS pass transistor) and must end at zero (because the current hits zero in this mode). So the mathematical mean value must be half the current limit value. As the current limit information internally is known, we can use this knowledge to estimate the average current during the NMOS on-time. Consequently the device P2 is ON whenever the NMOS pass transistor is ON.

In PWM mode the switch S1 is either sampling LX node or is open-circuit. The open circuit position 4 is shown in FIG. 1. Alternatively switch S1 may be in PWM mode left attached to LX node or to open circuit.

In PFM mode the switch S1 is either sampling the drain voltage of P2, whenever the NMOS or the PMOS pass transistor is on, or is connected to supply voltage VDD when none of the pass transistors is on, hence creating the rectangular pulses that equal the average current in the coil. Alternatively, instead of connecting to supply voltage VDD, the drain voltage of P2 can be used, while current I2 is turned ON/OFF.

Figure 6B:
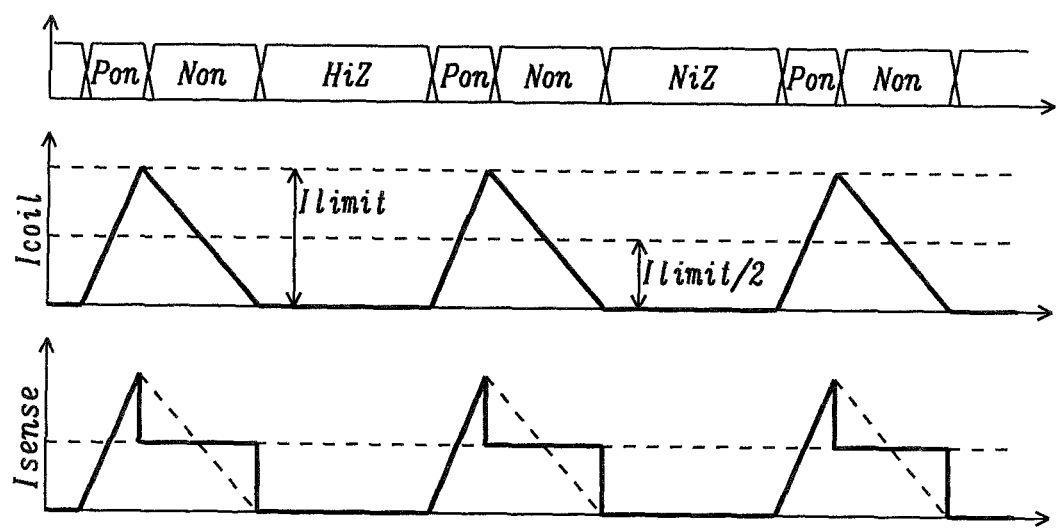

FIG. 6b shows time charts of the current through the coil Icon and the current sensed Isense in case of the PFM mode during different phases (PMOS is on, NMOS is on, neither pass device is on—HIZ). S1 selects whether the circuit is measuring the drop across the PMOS pass transistor (the actual coil current if the PMOS pass transistor is on), the estimated coil current (a static estimate of half the current limit value) or the supply voltage (which is equivalent to zero current). When neither pass-device is on (when the output is high impedance "Hiz" and the output current is zero) the circuit must sample a zero value. It can do this in one of two ways. The first is to sample the supply voltage. This can be done by setting se switch S1 to the top connection and sampling the supply directly. The other way is to set the current I2 to zero. As the PMOS P2 is held on, this is essentially the same thing. With no current through P2 there is no voltage drop across P2 and the voltage on its drain is the same as supply.

Figure 2:
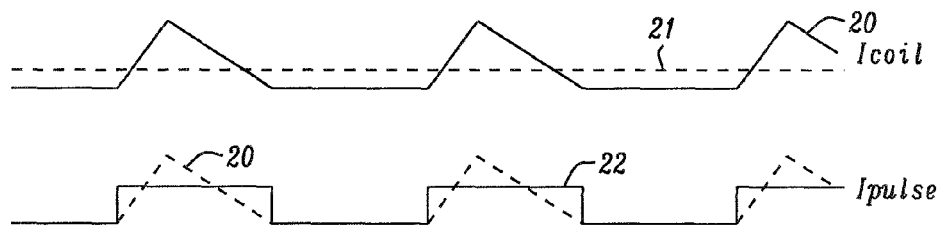
FIG. 2 show time charts of the coil current with the true long-term average indicated and of the pulses that would be used instead of sampling the actual LX voltage.

The time charts of FIG. 2 show the method disclosed. Trace 20 shows the coil current, with the true long-term average 21 indicated. Trace 22 shows the pulses that would be used instead of sampling the actual LX voltage. The coil current, correspondent to trace 20, is also shown by dotted line in order to demonstrate the conversion of the triangle shaped current wave to the rectangular pulses of trace 22.

After filtering the pulses of trace 22 with a long time-constant, an average current measurement in DCM PFM mode is available.

Figure 4:
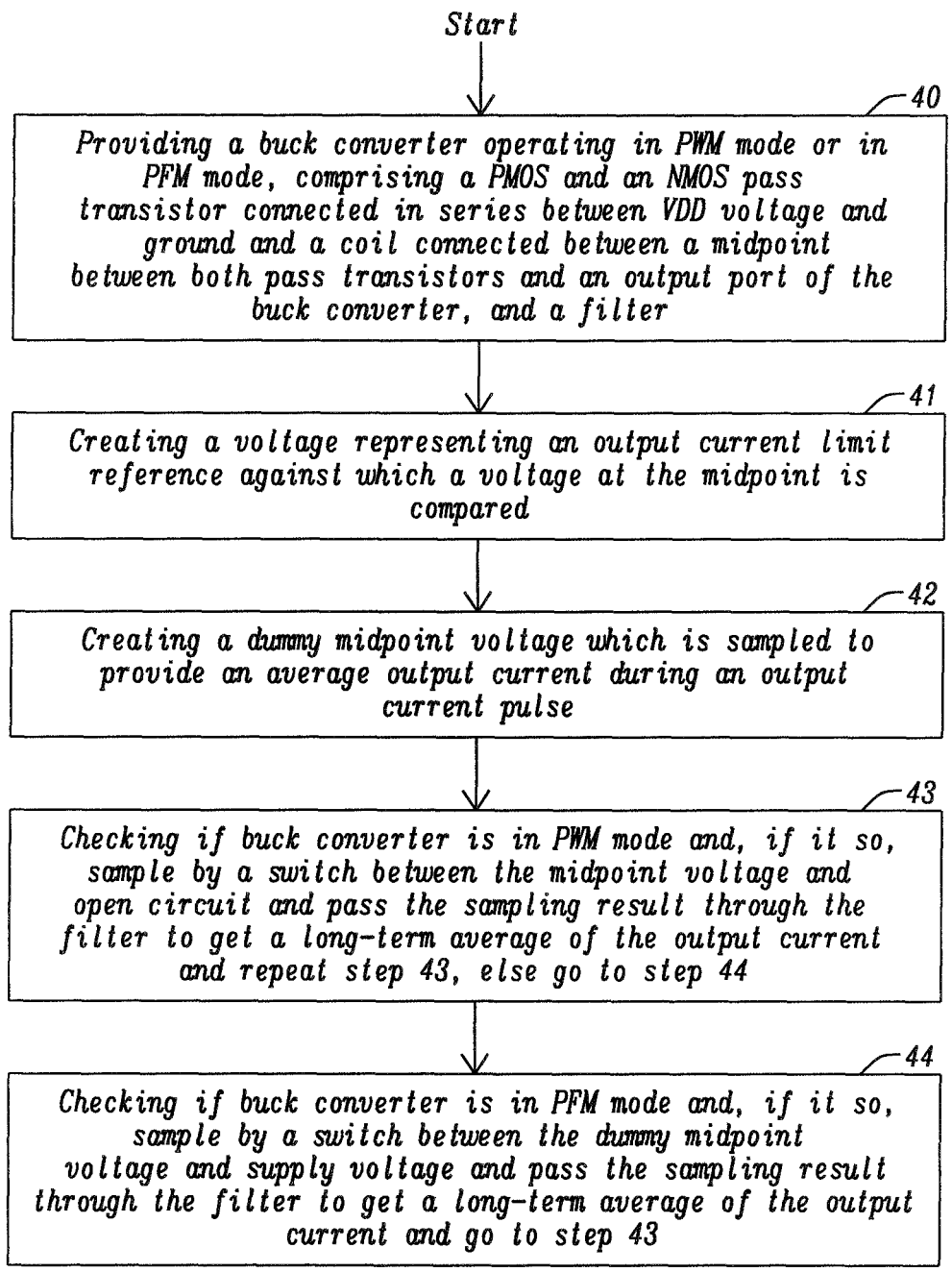
FIG. 4 depicts a flowchart of a method to measure an output current of a buck converter during DCM PFM mode and CCM PWM mode.

FIG. 4 depicts a flowchart of a method to measure an output current of a buck converter during DCM PFM mode and CCM PWM mode. A first step 40 depicts provision of a buck converter operating in PWM mode or in PFM mode, comprising a PMOS and an NMOS pass transistor connected in series between VDD voltage and ground and a coil connected between a midpoint between both pass transistors and an output port of the buck converter, and a filter. The next step 41 shows creating a voltage representing an output current limit reference against which a voltage at the midpoint is compared. Step 42 describes creating a dummy midpoint voltage which is sampled to provide an average output current during an output current pulse. Step 43 illustrates checking if buck converter is in PWM mode and, if so, sample by a switch between the midpoint voltage and open circuit and pass the sampling result through the filter to get a long-term average of the output current and repeat step 43, else go to step 44. The last step 44 depicts checking if buck converter is in PFM mode and, if so, sample by a switch between the dummy midpoint voltage and supply voltage and pass the sampling result through the filter to get a long-term average of the output current and go to step 43.

Figure 3:
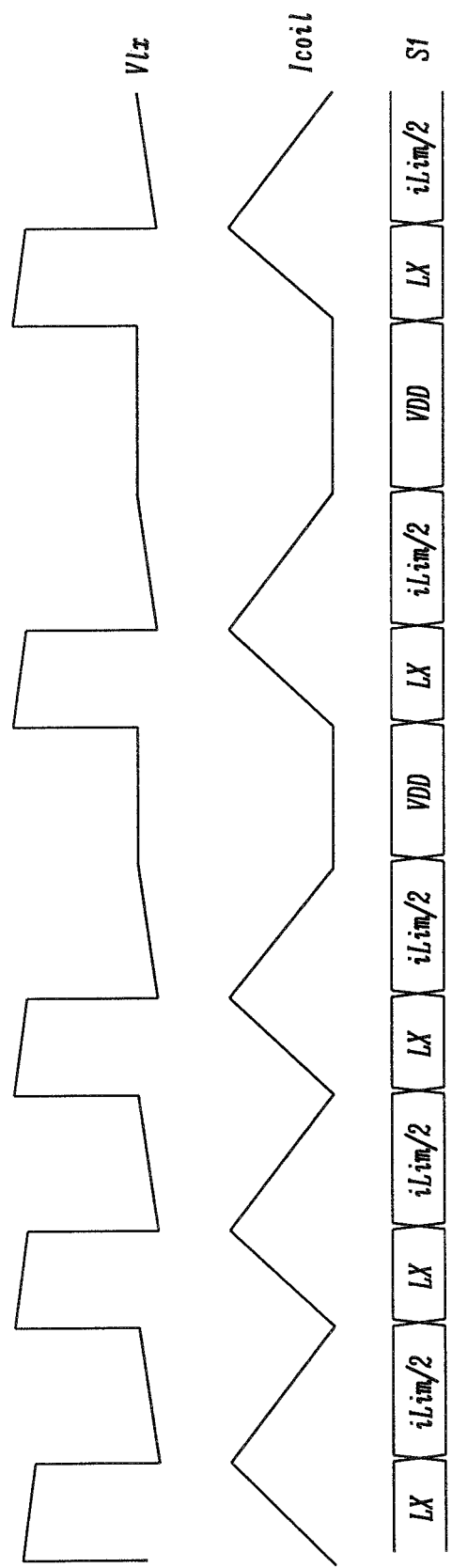
FIG. 3 shows three time chart traces of the voltage at the LX node, of the current through the coil Lout and the position of switch S1 during the various phases.

The method disclosed may be digitally implemented. In one embodiment of this digitally implemented method the current through the PMOS pass transistor would be measured on-time using an analog-to digital converter (ADC). This current measurement would then be digitally accumulated, and a constant value equal to half of the sleep current limit value during the NMOS on-time would be used. This constant value could be identified by peak-detect on the PMOS measurement in PFM. The digital control would also accumulate a zero code for times when the PMOS and NMOS are both off. FIG. 3 shows three time chart traces of the voltage at the LX node, of the current through the coil Lout and the position of switch S1 during the various phases.

Figure 5:
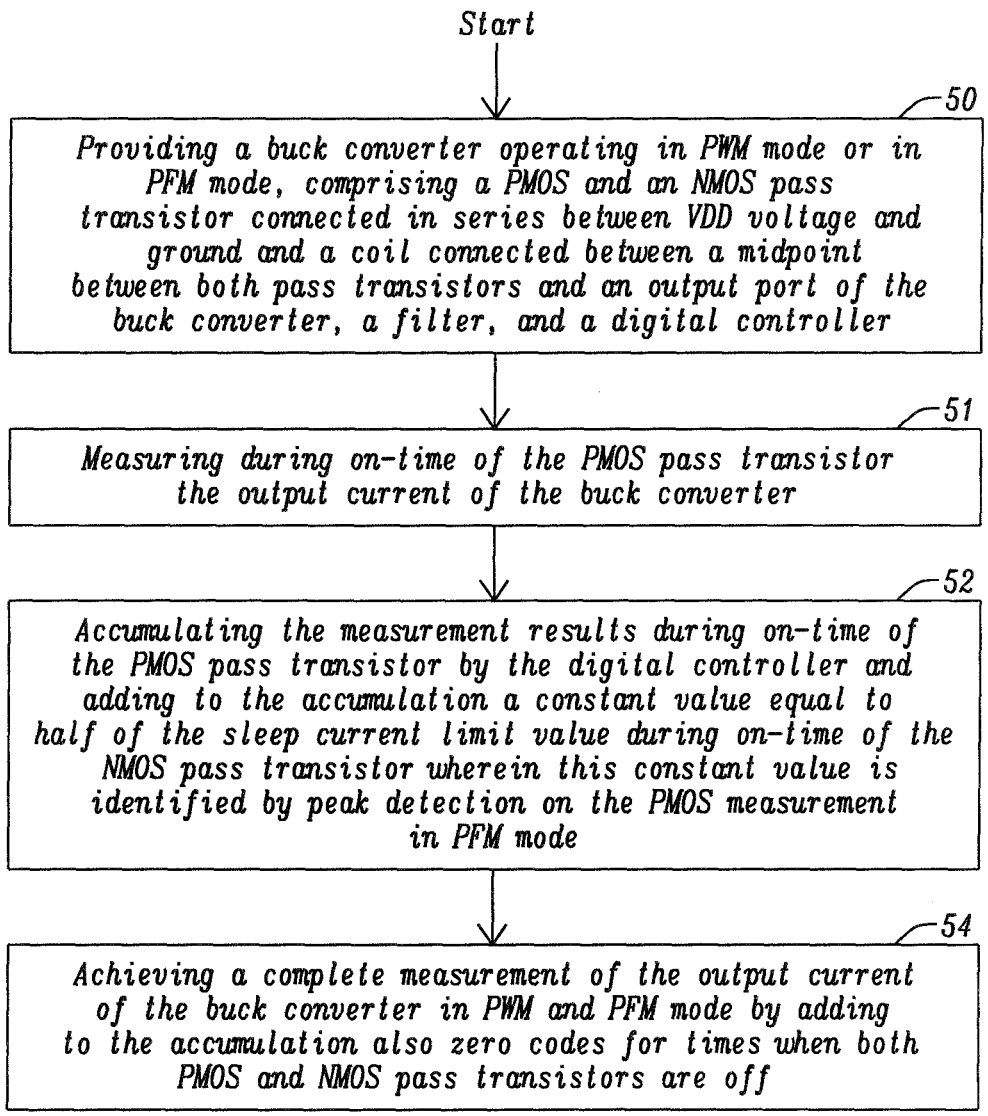
FIG. 5 depicts a flowchart of the method to measure digitally an output current of a buck converter during DCM PFM mode and CCM PWM mode.

FIG. 5 depicts a flowchart of the method to measure digitally an output current of a buck converter during DCM PFM mode and CCM PWM mode. A first step 50 depicts provision of a buck converter operating in PWM mode or in PFM mode, comprising a PMOS and an NMOS pass transistor connected in series between VDD voltage and ground and a coil connected between a midpoint between both pass transistors and an output port of the buck converter, a filter, and a digital controller. The next step 51 shows measuring during on-time of the PMOS pass transistor the output current of the buck converter. Step 52 illustrates accumulating the measurement results during on-time of the PMOS pass transistor by the digital controller and adding to the accumulation a constant value equal to half of the sleep current limit value during on-time of the NMOS pass transistor wherein this constant value is identified by peak detection on the PMOS measurement in PFM mode. The last step 53 depicts achieving a complete measurement of the output current of the buck converter in PWM and PFM mode by adding to the accumulation also zero codes for times when both PMOS and NMOS pass transistors are off.

While the disclosure has been particularly shown and described with reference to the preferred embodiments thereof, it will be understood by those skilled in the art that various changes in form and details may be made without departing from the spirit and scope of the disclosure.

What is claimed is:

1. A buck converter enabled for output current measurement comprising:
 a main output stage comprising a PMOS pass transistor and an NMOS pass transistor both connected in series, wherein the PMOS pass transistor is connected to supply voltage VDD and the NMOS pass transistor is connected to ground;

a coil, wherein a first terminal of the coil is connected to a mid-node between the PMOS pass transistor and the NMOS pass transistor and a second terminal of the coil is connected to an output port of the buck converter;

a circuitry configured to providing a first voltage node representing an output current limit of the buck converter and to providing a second voltage node to be sampled in PFM mode, whenever either the PMOS pass device or the NMOS pass device is on;

a switch, wherein a first terminal of the switch may contact multiple contact points and a second terminal of the switch is connected to a filter, wherein the switch is configured in PFM mode to either sampling the second voltage node in order to provide an average current during the output current pulse or to being connected to the supply voltage or a correspondent voltage and in PWM mode to either sampling the mid-node voltage between the PMOS pass transistor and the NMOS pass transistor or being connected to open circuit;

wherein the buck converter is configured to switch the PMOS pass transistor off when an output current through the coil reaches a maximum current limit, which is indicated by the first voltage node, and then the current through the coil falls linearly until the coil is completely discharged.

2. The buck converter of claim 1, wherein said circuitry comprises a first circuit branch and a second circuit branch.

3. The buck converter of claim 2, wherein the said first circuit branch is configured to generating a first reference current, comprising:

a first PMOS device, which is scaled to the PMOS pass transistor, wherein a gate of the first PMOS device is connected to the gate of the PMOS pass transistor, a source of the first PMOS device is connected to supply voltage, and a drain of the first PMOS device is connected via said first voltage node, providing a voltage representing an output current limit of the buck converter, to a first terminal of a first current source; and said first current source, wherein a second terminal of the current source is connected to ground.

4. The buck converter of claim 3, wherein the said second circuit branch is configured to generating a second reference current, which is scaled to the first reference current, comprising:

a second PMOS device, which is scaled to the PMOS pass transistor, a source of the second PMOS device is connected to supply voltage, a gate of the second PMOS device is connected to the gate of the PMOS pass transistor, and a drain of the second PMOS device is connected via said second voltage node capable to be sampled in PFM mode and to a first terminal of a second current source; and said second current source, wherein a second terminal of the current source is connected to ground.

5. The buck converter of claim 4 wherein the voltage at the second voltage node is configured in PFM mode to create rectangular pulses that equal after filtering an average current through the coil.

6. The buck converter of claim 4 wherein the second reference current through the second circuit branch is half of the first reference current.

7. The buck converter of claim 1 wherein the filter is a long-time-constant low-pass filter.

8. The buck converter of claim 1, wherein a first contact point of the switch is connected to the second voltage node, a second contact point is connected to the mid-node between the PMOS pass transistor and the NMOS pass transistor, and a third contact point is connected to supply voltage.

9. The buck converter of claim 1, wherein an output capacitor is connected between the output port and ground.

10. The buck converter of claim 1, wherein the buck converter is implemented in a Power Management Integrated Circuit.

11. The buck converter of claim 1, wherein the buck converter is enabled for output current measurement in CCM PWM mode.

12. The buck converter of claim 1, wherein the buck converter is enabled for output current measurement in DCM PFM mode.

13. The buck converter of claim 1, wherein the buck converter is a current controlled buck converter.

14. The buck converter of claim 1, wherein the buck converter is a voltage controlled buck converter.

15. The buck converter of claim 1, wherein the correspondent voltage is the voltage at the second node, whenever the NMOS pass device is off.

16. A method for output current measurement of a buck converter in CCM PWM mode as well as in DCM PFM mode, comprising the steps of:

(1) providing a buck converter operating in PWM mode or in PFM mode, comprising a PMOS and an NMOS pass transistor connected in series between VDD voltage and ground and a coil connected between a midpoint between both pass transistors and an output port of the buck converter, and a filter;

(2) creating a voltage representing an output current limit reference against which a voltage at the midpoint is compared;

(3) creating a dummy midpoint voltage which is sampled to provide an average output current during an output current pulse;

(4) checking if buck converter is in PWM mode and, if it so, sample by a switch between a mid-point voltage between both pass transistors or being connected to open circuit and pass the sampling result through the filter to get a long-term average of the output current and repeat step (4), else go to step 5; and (5) checking if buck converter is in PFM mode and, if it so, sample by a switch between the dummy midpoint voltage and supply voltage and pass the sampling result through the filter to get a long-term average of the output current and go to step 4.

17. The method of claim 16 wherein a switch is configured in PFM mode to either sampling the dummy midpoint voltage or to being connected to the supply voltage.

18. The method of claim 16 wherein a switch is configured in PWM mode to either sampling a mid-node voltage between the PMOS pass transistor and the NMOS pass transistor or to being connected to open circuit.

19. A method for digital output current measurement of a buck converter in CCM PWM mode as well as in DCM PFM mode, comprising the steps of:

(1) providing a buck converter operating in PWM mode or in PFM mode, comprising a PMOS and an NMOS pass transistor connected in series between VDD voltage and ground and a coil connected between a midpoint between both pass transistors and an output port of the buck converter, a filter, and a digital controller;

(2) measuring during on-time of the PMOS pass transistor the output current of the buck converter;

(3) accumulating the measurement results during on-time of the PMOS pass transistor by the digital controller and adding to the accumulation a constant value equal to half of the sleep current limit value during on-time of the NMOS pass transistor wherein this constant value is identified by peak detection on the PMOS measurement in PFM mode; and (4) achieving a complete measurement of the output current of the buck converter in PWM and PFM mode by adding to the accumulation also zero codes for times when both PMOS and NMOS pass transistors are off.

20. The method of claim 19 wherein the buck converter is a current control buck converter.

21. The method of claim 19 wherein the buck converter is a voltage control buck converter.

* * * * *